(12) United States Patent
Jürgensen et al.

(10) Patent No.: US 6,905,548 B2
(45) Date of Patent: Jun. 14, 2005

(54) DEVICE FOR THE DEPOSITION OF CRYSTALLINE LAYERS ON CRYSTALLINE SUBSTRATES

(75) Inventors: Holger Jürgensen, Aachen (DE); Gerhard Karl Strauch, Aachen (DE); Johannes Käppeler, Würselen (DE)

(73) Assignee: Aixtron AG (DE)

( * ) Notice: Subject to any disclaimer, the term of this patent is extended or adjusted under 35 U.S.C. 154(b) by 295 days.

(21) Appl. No.: 10/378,496

(22) Filed: Mar. 3, 2003

(65) Prior Publication Data
US 2003/0217696 A1 Nov. 27, 2003

Related U.S. Application Data

(63) Continuation of application No. PCT/EP01/08038, filed on Jul. 12, 2001.

(51) Int. Cl.[7] ............................. C23C 16/00; H01L 1/00
(52) U.S. Cl. ............. 118/715; 156/345.29; 156/345.33
(58) Field of Search ..................... 118/715; 156/345.29, 156/345.33, 345.34

(56) References Cited

U.S. PATENT DOCUMENTS 4,842,680 A * 6/1989 Davis et al. ................. 216/58
5,027,464 A   7/1991 Knowlton ..................... 15/83
5,788,777 A   8/1998 Burk, Jr. ..................... 118/730

FOREIGN PATENT DOCUMENTS

| DE | 198 13 523 | 10/1999 |
| EP | 0524073 | 1/1993 |
| WO | WO 96/00314 | 1/1996 |
| WO | WO 02/18679 A1 * | 3/2002 |

* cited by examiner

Primary Examiner—Luz Alejandro-Mulero
(74) Attorney, Agent, or Firm—St. Onge Steward Johnston & Reens LLC

(57) ABSTRACT

The invention relates to a device for the deposition of in particular, crystalline layers on one or several, in particular, equally crystalline substrates, comprising a process chamber, arranged in a reactor housing, which may be charged with the substrates from above, by a reactor housing opening which may be sealed by a cover. The reactor housing opening opens out into a glove box, in particular flushed with highly pure gas and connects electricity, liquid or gas supply lines to the cover. According to the invention, the connection of supply lines for electricity, fluid or gas sources arranged outside the glove box to the cover of the reactor housing arranged within the glove box may be improved, whereby the electricity, fluid or gas supply lines run freely, from outside the glove box, through a flexible tube which is sealed atone end to a flange arrangement rigidly fixed to the cover and sealed at the other end to an opening in the glove box wall.

9 Claims, 2 Drawing Sheets

DEVICE FOR THE DEPOSITION OF CRYSTALLINE LAYERS ON CRYSTALLINE SUBSTRATES

This application is a continuation of pending International Patent Application No. PCT/PCT/EP01/08038 filed Jul. 12, 2001, which designates the United States and claims priority of pending German Application No. 100 43 597, filed Sep. 1, 2000.

FIELD OF THE INVENTION

The invention relates to a device for depositing in particular crystalline layers on one or more, in particular likewise crystalline substrates, having a process chamber which is disposed in a reactor housing and can be loaded with the substrates from above through a reactor opening which can be closed off by means of a cover, the reactor-housing opening out into a glove box, which in particular is purged with ultra pure gas, and current, liquid or gas connection lines leading to the cover.

Devices of this type are in use, and these CVD installations are used to deposit semiconductor layers on semiconductor substrates. Reaction gases used are, inter alia, metal-organic compounds and hydrides, for example of elements from main groups III and V.

A reactor housing, which has a reactor-housing opening closed by a cover, with gas feed lines leading to the cover, is shown in U.S. Pat. No. 5,027,464. DE Patent 19 813 523 C2 also shows a reactor housing of this type with a process chamber located therein.

U.S. Pat. No. 5,788,777 shows a device for depositing SiC. In this case, the reaction gases, silane and propane, together with a carrier gas, hydrogen, are passed through a central gas-admission element to the process chamber. The central gas-admission element carries a cover plate of the process chamber.

SUMMARY OF THE INVENTION

The invention is based on the object of improving the way in which connection lines are guided from current, liquid or gas sources disposed outside a glove box to the cover of the reactor housing, which is disposed inside the glove box.

The object is achieved by the invention described in the claims. The invention provides that the current, liquid or gas connection lines are led freely through a flexible tube which on one end side is connected in a sealed manner to a flanged-on member seated rigidly on the cover and at the other end side is connected in a sealed manner to an opening in the glove box wall. In a refinement of the invention, the flanged-on member is not seated directly on the cover, but rather is at a spacing from the cover. For this purpose, there is a support which holds the flanged-on member rigidly to the cover. The flanged-on member may be a plastics plate. This makes it easier to lead through electrical conductors, such as in particular the feed lines for the HF coil. In a preferred configuration of the invention, the cover plate of the process chamber is seated fixedly on the cover. The HF coil, which is likewise fixedly connected to the cover, is located between the reactor-housing cover and the cover plate. If the cover is raised in order for substrates to be loaded into or unloaded from the process chamber, which can be carried out using suitable pneumatic cylinders, HF coil and process-chamber cover plate are also lifted with it. In the process, the flexible tube is compressed. The supply lines guided freely therein then move through the opening of the glove box. The flexible tube is in particular a corrugated hose.

The carrier plate is heated from below, likewise by means of an HF coil. The two HF coils can be powered by separate HF generators. This allows individual control of substrate temperature and cover temperature. The substrate temperature is approximately 1600° C. For this purpose, the carrier plate, which preferably consists of graphite, is heated to a temperature of 1700° C. to 1800° C. The surface temperature of the cover plate consisting of graphite is approximately 1600° C. The region of the cover plate which directly adjoins the gas-admission element is also at such a high temperature. On account of cooling, the gas-admission element is at a temperature of less than 100° C.

BRIEF DESCRIPTION OF THE DRAWINGS

An exemplary embodiment of the invention is explained below with reference to accompanying drawings, in which.

DETAILED DESCRIPTION OF THE DRAWINGS

Figure 1:
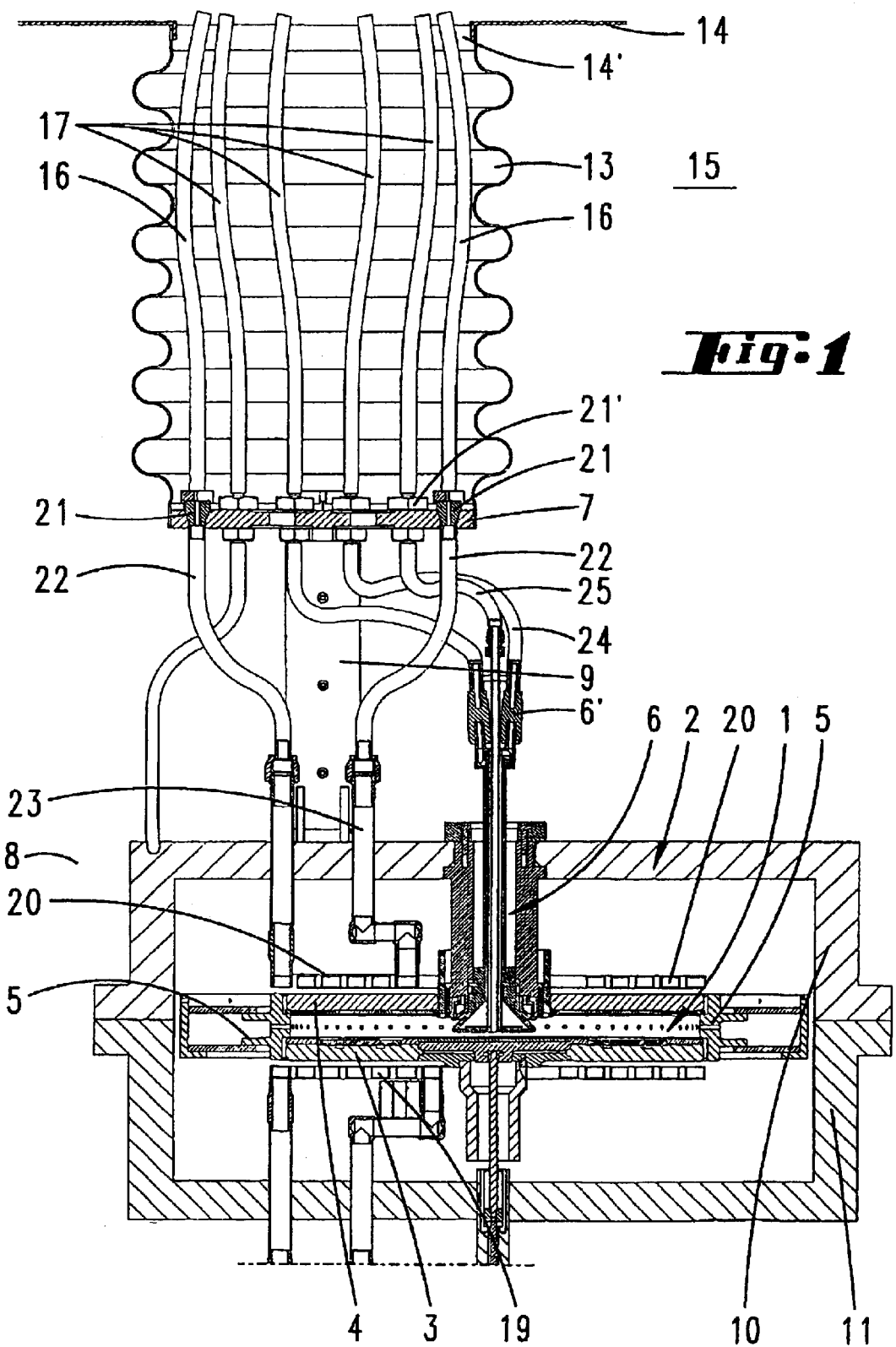
FIG. 1 shows, in diagrammatic representation, the reactor, comprising the process chamber disposed in the reactor housing with the supply lines passing through an opening in a wall of a glove box.
Figure 2:
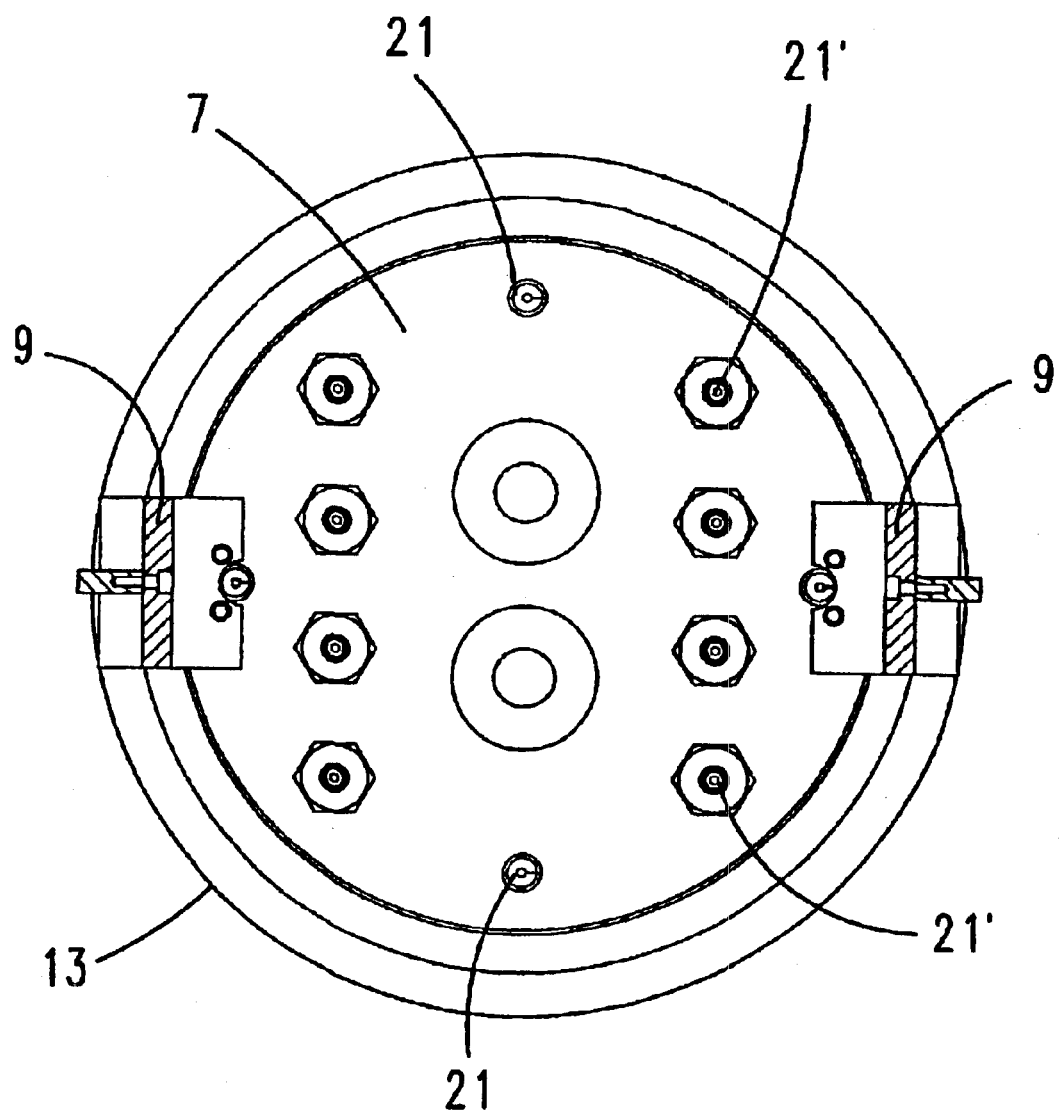
FIG. 2 shows a worm's eye view of the connection member.

The device illustrated in the exemplary embodiment is used for the monocrystalline deposition of SiC layers on monocrystalline Si substrates in a hot-wall reactor. These substrates may have a diameter of 4 inches. The device is located in a housing (not shown in the drawings). This housing has a glove box which is used for loading and unloading the process chamber. The cover 8 of the reactor housing 2 can be opened in the glove box 15. In the process, the cover 8, together with a gas-admission element 6 secured to the cover, a high-frequency coil 19 which is likewise secured thereto and a cover plate 4 secured to the gas-admission element 6, lifts off. Furthermore, an upper housing-wall section 10, which rests on a lower housing-wall section 11 by means of seals, also lifts off therewith, so that the substrate holders supported by the carrier plate 3 can be loaded with substrates.

The feed lines 16 for the HF coil 19 are in flexible tube form. They, like further gas or cooling-water feed lines 17, are located in a corrugated hose 13. One end of this corrugated hose 13 is sealingly connected to an opening 14' in the glove box wall 14. For this purpose, the opening 14' has a collar, for example. The other end of the corrugated hose 13 is sealingly connected to a flanged-on member 7. This flanged-on member 7 comprises a circular plastics or Pertinax plate. In this plate, there are feed-line lead-throughs 21, 21', onto which hoses or tubes 16 of the HF feed lines are screwed or fitted. The plate 7 is spaced apart from the cover 8. It is rigidly connected to the cover 8, but via a support 9.

When the cover 8 is lifted, the corrugations of the corrugated hose 13 are pushed together. The lines 16, 17 located freely therein can then be pushed through the opening 14'.

The process chamber 1 is located in the reactor housing 2. This process chamber 1 has a carrier plate 3, which bears substrate holders. A cover plate 4 extends parallel to and above the carrier plate 3. The carrier plate 3 is heated from below by means of a water-flushed HF coil 19. The cover plate 4 is heated from above by an HF coil 20, which is likewise water-cooled. The carrier plate 3 is configured in the shape of ring, the outer diameter being approximately twice its inner diameter.

Immovable, in particular rigid connection lines, 25, 25 run from the flanged-on member 7, which is located parallel to and at a spacing from the housing cover 8, to the lead-throughs 23, which form the line connections through the housing cover 8. Further lines run to the head 6' of the gas-admission element 6. These are the feed lines for the reaction gases and the feed and discharge line for the cooling water of the cooled gas-admission element 6.

In the exemplary embodiment, the circular disk, which forms the flanged-on member 7, is located directly opposite the opening 14' in the glove box. The diameter of the opening 14' substantially corresponds to the diameter of the flanged-on member 7. In the plate 7 there are pipe screw connections 21' and lead-throughs 21 for the HF feed lines 16, which are in flexible-tube form.

The following method of operation is established:

if the cover 8 is lifted by pneumatic cylinders (not shown), the connection member 7 moves toward the opening 14'. The lines 16, 17 located in the corrugated tube 13 are pushed through the opening 14' in regions. Any length-compensation sections which may be present in the feed lines can be disposed outside the glove box 15, so that the volume of the glove box 15 which is filled with pure gas can be minimal.

All features disclosed are (inherently) pertinent to the invention. The disclosure content of the associated/appended priority documents (copy of the prior application) is hereby incorporated in its entirety in the disclosure of the application, partly for the purpose of incorporating features of these documents in claims of the present application.

What is claimed is:

1. A device for depositing crystalline layers on one or more, crystalline substrates, having a process chamber which is disposed in a reactor housing and can be loaded with the substrates from above through a reactor opening which can be closed off by means of a cover, the reactor-housing opening out into a glove box, which is purged with ultra pure gas, and current, liquid or gas connection lines leading to the cover, characterized in that the current, liquid or gas connection lines are led from outside the glove box to the cover freely through a flexible tube which on one end side is connected in a sealed manner to a flanged-on member seated rigidly on the cover and at the other end side is connected in a sealed manner to an opening in the glove box wall.

2. The device according to claim 1, characterized in that the flanged-on member is secured rigidly to and is spaced from the cover by means of a support.

3. The device according to claim 1, characterized in that the flanged-on member is a plastic plate with gastight lead-throughs or screw connections for the supply lines.

4. The device according to claim 1, further comprising a cover plate, which is fixedly connected to the cover via a gas-admission element, of the process chamber.

5. The device according to claim 4, further comprising a high-frequency coil, which is fixedly connected to the cover and is water-cooled, for heating the cover plate.

6. The device according to claim 4, further comprising a carrier plate which is driven in rotation and on which substrate holders, which each rotate on one gas bearing, are seated.

7. The device according to claim 6, characterized in that the cover plate and the carrier plate can be heated separately.

8. The device according to claim 1, characterized in that the flanged-on member extends parallel to and directly beneath the opening.

9. The device according to claim 1, characterized in that the flanged-on member and the opening have an approximately identically sized cross-sectional area.

\* \* \* \* \*